United States Patent [19]
Lando

[11] 3,900,614
[45] Aug. 19, 1975

[54] METHOD OF DEPOSITING A METAL ON A SURFACE OF A SUBSTRATE

[75] Inventor: David Jacob Lando, Lawrence Twp., Mercer County, N.J.

[73] Assignee: Western Electric Company, Incorporated, New York, N.Y.

[22] Filed: Aug. 16, 1973

[21] Appl. No.: 388,842

Related U.S. Application Data

[62] Division of Ser. No. 202,305, Nov. 26, 1971, Pat. No. 3,793,072.

[52] U.S. Cl. .................. 427/258; 117/130 E; 106/1
[51] Int. Cl. .............................................. B44d 1/18
[58] Field of Search ............. 117/212, 130 E; 106/1

[56] References Cited

UNITED STATES PATENTS 3,607,352 9/1971 Fadgen, Jr. ......................... 117/212

*Primary Examiner*—John D. Welsh
*Attorney, Agent, or Firm*—J. Rosenstock

[57] ABSTRACT

A method of depositing a metal on a surface of a substrate is disclosed. A suitable colloidal sensitizing solution, comprising insoluble hydrous oxide particles, selected from among solutions revealed in application Ser. No. 8,022, filed Feb. 2, 1970, is applied to a surface of a substrate. The sensitized substrate surface is then treated with a suitable redox agent to delineate a pattern capable of reducing an activating metal ion to an activating metal. Alternatively, a positive colloidal sensitizing solution, i.e., a solution comprising ions capable of reducing an activating metal ion to an activating metal is applied to the surface and the sensitized surface is then treated with an activating metal ion containing solution to deposit an activating metal pattern thereon. Alternatively, a colloidal activating metal solution is applied to the surface and the surface is then treated with a solution comprising an ion capable of reducing an activating metal ion to deposit an activating metal pattern thereon.

2 Claims, 7 Drawing Figures

METHOD OF DEPOSITING A METAL ON A SURFACE OF A SUBSTRATE

This is a division of application Ser. No. 202,305 filed Nov. 26, 1971, now U.S. Pat. No. 3,793,072.

BACKGROUND OF THE INVENTION

1. Field of the Invention

This invention relates to a method of depositing a metal on a surface of a substrate and more particularly, to a method of selectively depositing a metal pattern on a surface of an electrically non-conducting substrate.

2. Discussion of the Prior Art

There is a growing need in various device and circuit applications for an inexpensive process which will produce adherent conducting circuit patterns on a non-conductor surface. Most of the processes used for metallic pattern generation involve a photographic step. Pattern resolution may be good but most methods are often slow, involving many process steps, and are relatively expensive.

A conventional method for producing macro circuit patterns employs a copper-clad insulator board coated with a photoresist material which is photoexposed and chemically processed to selectively remove copper, leaving a desired circuit pattern. This method is effective but wasteful of copper and chemicals. The high cost of this method has encouraged research and development toward new techniques for metallic pattern generation on a non-conductor surface.

An electroless metal deposition process is especially attractive for metallic pattern generation since one only needs to produce a pattern of a suitable catalyst on a substrate and metal deposition will occur only on that pattern. One selective electroless metal deposition which is employed includes applying a sensitizer solution, e.g., stannous chloride, capable of reducing an activating metal ion, e.g., $Pd^{+2}$, to an activating metal, e.g., $Pd^{o}$, to a non-conductive surface by means of a stamp printing apparatus or stencil, whereby a sensitized pattern is formed. The selectively sensitized surface (stamped, printed or stenciled) is then immersed in an activating solution, comprising an activating metal salt, wherein an activating metal is reduced on the pattern produced by the stamp, stencil, etc. The activating metal-reduced surface is then subjected to a conventional electroless metal deposition bath.

An inherent problem in the stamping, stenciling or printing methods is the poor resolution of the resultant metal pattern obtained. Frequently, especially where the surface to be metal patterned is a hydrophobic surface, e.g., a plastic, glass, glazed ceramic surface, the stamped, printed or stenciled sensitizing solution tends to run, thereby ultimately leading to a deposited metallic pattern which is "blurred," i.e., irregularly delineated.

It is important to rinse a sensitized surface during the electroless metal deposition process. If such is not done, there is a possibility that excess sensitizer will cause reduction of an activating species, e.g., $Pd^{+2}$ (activating metal ion), to which the sensitized surface is destined to be exposed, in non-adherent form on the surface. A non-adherent deposit can subsequently lead to an autocatalytic decomposition of the electroless bath. However, with the conventional stamping and/or stenciling and/or printing sensitizing solutions and techniques employed, such rinsing cannot be carried out since a resultant blurred image will be obtained. A method whereby selective metal deposition can be attained utilizing stamping and/or stenciling and/or printing techniques, resulting in improved pattern resolution without running of the various solutions employed therewith and without blurring of the resultant metal deposit is desired and needed.

SUMMARY OF THE INVENTION

The present invention relates to a method of depositing a metal on a surface of a substrate and, more particularly, to a method of selectively depositing a metal pattern on a surface of an electrically non-conducting substrate.

The method includes coating a surface of the non-conducting or dielectric substrate with a suitable colloidal wetting solution. Suitable colloidal wetting solutions (positive sensitizers, negative solutions) are those disclosed in Kenney, Ser. No. 8,022, filed Feb. 2, 1970, now U.S. Pat. Nos. 3,657,003 assigned to the assignee hereof and incorporated by reference hereinto. At least one area of the colloidal wetting solution coated surface is treated with a suitable redox agent to describe or delineate at least one sensitized area of the coated surface which is capable of reducing an activating metal ion, e.g., $Pd^{+2}$, to an activating metal, e.g., Pd. The sensitized area so capable, is then treated with a solution comprising the activating metal ion to reduce the activating metal ion to the activating metal and deposit the reduced activating metal thereon.

In a second embodiment of the present invention, the surface of the substrate is coated with a solution comprising an activating metal ion, e.g., $Pd^{+2}$, $Pt^{+2}$, $Au^{+3}$, etc. The coated surface is then selectively contacted, e.g., by means of a stamp, stencil, etc., with a suitable positive colloidal sensitizing solution or sensitizer, i.e., a solution capable of directly reducing the activating metal ion to its corresponding activating metal (revealed in Kenney) to selectively deposit the reduced activating metal thereon. Alternatively, the suitable positive colloidal sensitizer, or any solution, colloidal or non-colloidal, comprising an ionic species capable of reducing the selected activating metal ion to the activating metal may be first applied to the surfaces of the substrate. A suitable colloidal activating wetting solution is then selectively applied to the coated surface, e.g., by means of a stamp, etc., to selectively deposit the activating metal thereon.

In a third embodiment, a suitable positive colloidal wetting solution revealed in Kenney, referred to above, is selectively applied or impressed on the surface of the substrate to delineate a pattern. The patterned surface is then treated with an activating solution to deposit an activating metal thereon. Alternatively, a suitable colloidal wetting solution, comprising activating metal ions, revealed in Kenney, referred to above, is selectively applied or impressed on the surface of the substrate to delineate an activated pattern. The activated pattern is then treated with a suitable solution, comprising ions capable of reducing the activating metal ion to the activating metal, to deposit an activating metal thereon.

Once the activating metal is deposited on the surface, by any of the above-described embodiments, the activating metal-deposited surface may then be subjected to an electroless metal deposition whereby an electroless metal deposit is obtained.

DESCRIPTION OF THE DRAWING

The present invention will be more readily understood by reference to the following drawing taken in conjunction with the detailed description, wherein.

DETAILED DESCRIPTION

The present invention has been described primarily in terms of selectively depositing Pd and Cu on a surface of an insulative substrate by stamping means. However, it will be understood that such description is exemplary only and is for purposes of exposition and not for purposes of limitation. It will be readily appreciated that the inventive concept described is equally applicable to depositing other suitable metals which are reduced from their respective ions either (1) directly by ions contained in a colloidal wetting solution of Kenney, Ser. No. 8,022, filed Feb. 2, 1970, assigned to the assignee hereof and incorporated by reference hereinto; or (2) by a redox product of the colloidal wetting solution, resulting from an appropriate redox treatment of at least one ion contained in the Kenney wetting solution; or (3) by an activating metal such as Pd, Pt, Au, etc., which in turn is reduced from its respective ion by a suitable ionic species which may be contained in the colloidal wetting solution or the redox product thereof. The term redox product refers to a product resulting from either an oxidation or a reduction to a different valence state of at least one metal ion, contained in the colloidal wetting solution, by a suitable oxidizing agent or a suitable reducing agent (collectively referred to as a redox agent), respectively.

It will also be appreciated that the selective deposition may be carried out using stamping means, e.g., a stamp, a die, etc., printing means, e.g., a conventional printing press, brushing means, stenciling, etc.

Figure 1:
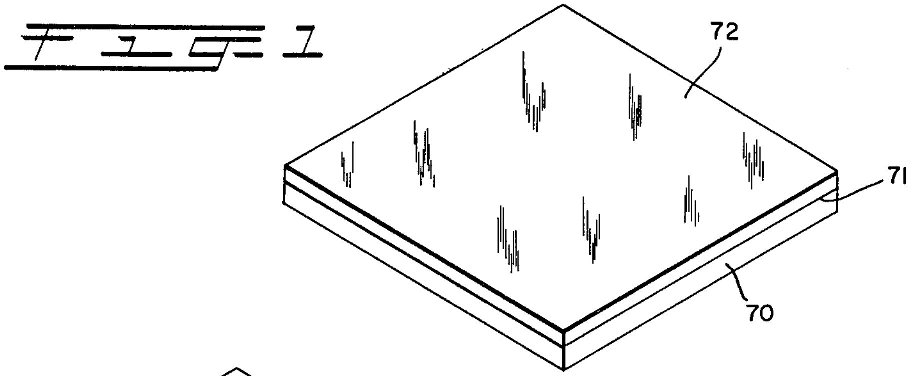
FIG. 1 is an isometric view of a typical substrate having a surface coated with a colloidal sensitizing solution.

Referring to FIG. 1, there is shown a suitable substrate 70. For the production of electrical circuit patterns suitable substrates are those which are generally non-conductive. In general, all dielectric materials are suitable substrates. A suitable colloidal wetting solution is selected and applied to a surface 71 of the substrate 70 to form a coat or layer 72 thereon. A suitable colloidal wetting solution includes at least one aqueous wetting solution revealed in Kenney, Ser. No. 8,022, filed Feb. 2, 1970, assigned to the assignee hereof and incorporated by reference herein. The wetting solution is generally described as a stable colloidal solution formed by a controlled hydrolysis and nucleation reaction in an aqueous medium wherein colloidal particles of the colloidal wetting solution (1) have a size within the range of 10A to 10,000A and (2) comprise an insoluble hydrous oxide of one or more selected elements. The hydrolysis reaction includes dissolving a salt of the selected element in the aqueous medium and maintaining the pH of the aqueous medium at a point where no flocculate results. Some suitable elements include Ti, V, Cr, Fe, Sn, Pb, and Bi.

More specifically, the following solutions disclosed in Kenney are some suitable colloidal wetting solutions:

1. The blue wetting solution of Example III-A which is obtained by (a) adding particulated titanium metal [$Ti^o$] to a hot or boiling (about 80°C) concentrated monobasic acid, such as HCl, until 0.2–3 weight percent of the titanium is dissolved; (b) cooling the resultant solution to room temperature; and (c) slowly raising the initial pH with a univalent alkali such as NaOH, until it is within the range of about 1.0 to 1.5.

2. The blue wetting solution to Example III-B which is obtained by (a) adding particulated titanium metal [$Ti^o$] to a hot or boiling (about 80°C) concentrated univalent acid, such as $HNO_3$, until 0.2–3 weight percent of the titanium is dissolved; (b) cooling the resultant solution to room temperature; and (c) slowly raising the initial pH, with a univalent alkali, such as NaOH, until it is within the range of about 1.0 – 1.5.

3. The yellow wetting solution of Example III-C which is obtained by (a) adding particulated titanium metal [$Ti^o$] to a hot or boiling (about 80°C) concentrated univalent acid, such as HCl or $HNO_3$, until 0.2–3 weight percent of the titanium is dissolved; (b) cooling the resultant solution to room temperature; and (c) adding sufficient $H_2O_2$ to quantitatively render all the dissolved titanium [$Ti^{+3}$] to $Ti^{+4}$; and (d) raising the pH with a univalent alkali, such as NaOH, until the pH is within the range of about 1.2–2.0.

4. The pale yellow wetting solution of Example III-E which is obtained by (a) adding 1 gram of fused titanium metal [$Ti^o$] to 70 ml. of concentrated HCl; (b) boiling the HCl until all of the titanium is dissolved and reacted; (c) raising the pH to about 0.5 with NaOH (1N); (d) adding dilute 50% $H_2O_2$ to the resultant solution until a colorless solution is obtained (with 1–2 drops of 50% $H_2O_2$ in excess); and (e) raising the pH to about 1.0–1.2 with 1N NaOH.

5. The brown-red wetting solution of Example V-C which is obtained by (a) adding one-half weight percent of vanadium tetrachloride [$VCl_4$] to concentrated HCl; and (b) raising the pH to about 1, e.g., by diluting with $H_2O$.

6. The green wetting solution of Example VI which is obtained by (a) dissolving one-half weight percent of chromic chloride in 100 ml. of deionized water; and (b) raising the initial pH to about 5 with a univalent alkali.

7. The tan wetting solution of Example X-A which is obtained by dissolving 1 weight percent of ferric chloride [$FeCl_3 \cdot 6H_2O$] in 100 ml. of deionized water (the dissolution being aided by heating to about 50°–80°C with stirring).

8. The coffee-pumpkin colored wetting solution of Example X-B which is obtained by (a) dissolving 0.5–5% of ferric chloride [$FeCl_3 \cdot 6H_2O$] in 100 ml. of deionized water; (b) adjusting the final pH of the resultant solution to about 1.5–2.0 with either HCl (at low $FeCl_3$ concentration) or NaOH (at high $FeCl_3$ concentration); and (c) heating the solution to 70°C within 20 minutes.

9. The coffee-pumpkin colored wetting solution of Example X-C which is obtained by (a) dispersing 1.5 weight percent of ferric chloride [$FeCl_3 \cdot 6H_2O$] in 100 ml. of deionized water to a final pH of about 1.7–1.9; and (b) permitting the resultant solution to stand ambient for 1–2 weeks.

10. The coffee-pumpkin colored wetting solutions of Examplee X-D which are obtained using the same procedures of Example X-B and X-C [(8) and (9) above] with iron acetate, nitrates, citrates or bromides. Where acetate is employed, the solution contains an excess of acetic acid and requires heating to 60°C for 1 hour.

11. The wetting solutions of Example X-E which are obtained by (a) heating 100 ml. deionized water to 70°C and dissolving therein ½–5 weight percent of either ferric chloride [$FeCl_3 \cdot 6H_2O$] or ferric nitrate [$Fe(NO_3)_3 \cdot 6H_2O$].

12. The wetting solutions of Example X-F which are obtained by (a) dissolving 1 weight percent ferric oxide [$Fe_2O_3$] in 100 ml. of deionized water; and (b) lowering the pH of the resultant solution from 3–3.5 to 1.0 with a univalent acid such as HCl, or alternatively, raising the pH to 11 with a univalent alkali.

13. The wetting solution of Example X-G which is obtained by (a) adding one weight percent of powdered ferrous oxide to 100 ml. of deionized water; (b) ultrasonically agitating the resultant mixture to dissolve the $Fe_3O_4$; and (c) lowering the initial pH (3.0–3.5) to about 1.0 with a univalent acid, such as HCl.

14. The pale yellow wetting solution of Example XXVI-F which is obtained by (a) dissolving in 100 ml. of deionized water, 0.1–5 weight percent of stannous chloride [$SnCl_2$] and 0.1–5 weight percent (with respect to the $H_2O$) of stannic chloride [$SnCl_4$] in any proportion to each other; and (b) adjusting the pH to about 0.7–1.8.

15. The pale yellow wetting solution of Example XXVI-G which is obtained by (a) dissolving 1 weight percent of powdered stannic chloride [$SnCl_4 \cdot 5H_2O$] in 100 ml. of deionized water; (b) dissolving 2 weight percent of stannous chloride [$SnCl_2 \cdot 2H_2O$] therein; and (c) dissolving an additional 1.5 weight percent stannous chloride [$SnCl_2 \cdot 2H_2O$].

16. The pale yellow wetting solution of Example XXVI-H which is obtained by (a) dissolving 1 weight percent of stannous chloride [$SnCl_2 \cdot 2H_2O$] in 100 ml. of deionized water; (b) adding sufficient HCl thereto to lower the pH to about 0.5–1.5; and (c) heating the resultant solution at about 55°C for 2 hours or in the alternative, adding $H_2O_2$ in place of or in addition to the heating step.

17. The colorless (milky white) wetting solution of Example XXVII which is obtained by (a) dissolving 1 weight percent of either lead chloride [$PbCl_2$] or lead nitrate [$Pb(NO_3)_2$] in 100 ml. of deionized water; and (b) slowly raising the initial pH of the resultant solution with a dilute univalent alkali, such as NaOH, to a pH of about 6–7.

18. The colorless (milky white) wetting solution of Example XXVIII which is obtained by (a) dissolving 1 weight percent of bismuth trichloride [$BiCl_3$] in 100 ml. of dilute (pH about 2) HCl; and (b) raising the pH of the resultant solution to about 3–4 with NaOH.

19. The wetting solution of Example XXXIII-A which is obtained by (a) adding 1 gram of fused titanium metal [$Ti^o$] to 70 ml. of concentrated HCl, which is boiled until the solution assumes a blue color; (b) maintaining a heat input without boiling the resultant solution until all of the titanium is dissolved and reacted to give a blue-purple solution having a very low pH; (c) raising the pH to about 0.5 with 1N-NaOH resulting in a pale lavender solution; (d) adding dilute 50% $H_2O_2$ until the solution is colorless, and then adding two additional drops in excess; (e) raising the pH with 1N-NaOH to about 1.0–1.2, resulting in a pale yellow solution; and (f) adding 1 weight percent of stannous chloride to 100 ml. of the pale yellow solution.

20. The pumpkin colored wetting solution of Example XXXIII-B which is obtained by (a) dissolving 1 weight percent of ferric chloride [$FeCl_3 \cdot 6H_2O$] in 100 ml. of deionized water (aiding dissolution by gradually heating to about 50°–80°C and stirring), resulting, at a pH of about 1.7–1.9, in a tan solution; and (b) dissolving 2 weight percent stannous chloride [$SnCl_2 \cdot 2H_2O$] in 100 ml. of the tan solution thereby lowering the pH to about 1.5.

21. The wetting solution of Example XXXIII-C which is obtained by (a) heating 100 ml. of deionized water to about 60°C; (b) adding 1 weight percent of aluminum chloride [$AlCl_3 \cdot 6H_2O$] thereto; (c) raising the initial pH (about 2.5) to about 5.0–5.2 while the solution is still hot, with a univalent alkali such as 1N-NaOH; (d) cooling the solution to room temperature; and (e) dissolving 0.1 weight percent of stannous chloride [$SnCl_2 \cdot 2H_2O$] therein.

22. The pale yellow wetting solution of Example XXXIII-D which is obtained by dissolving 1 weight percent of ferric chloride [$FeCl_3 \cdot 6H_2O$] and 1 weight percent of stannous chloride [$SnCl_2 \cdot 2H_2O$] in 100 ml. of deionized water.

23. The pale yellow wetting solution of Example XXXIII-E which is obtained by (a) dissolving 1 weight percent of ferric chloride [$FeCl_3 \cdot 6H_2O$] and 1 weight percent of stannous chloride [$SnCl_2 \cdot 2H_2O$] in 100 ml. of deionized water; and (b) dialyzing the solution to a final pH of about 5–5.5.

24. The colorless (milky white) wetting solution of Example XXXIII-F which is obtained by adding 1 weight percent of stannous chloride [$SnCl_2 \cdot 2H_2O$] to a suspension of CAB-O-SIL$^R$ in 100 ml. of deionized water. CAB-O-SIL$^R$ is a fumed silica made by flame hydrolysis.

25. The yellow wetting solution of Example XXXIII-H which is obtained by (a) dissolving 1–3 weight percent of stannous chloride [$SnCl_2 \cdot 2H_2O$] in 100 ml. of deionized water; (b) adding sufficient HCl to clear the solution, the final pH of the cleared solution being 0.5–1.0; and (c) dissolving 1 weight percent of zinc metal therein.

26. The green wetting solution of Example XXXIII-I which is obtained by (a) dissolving 0.5% of chromic chloride [$CrCl_6 \cdot 6H_2O$] in 100 ml. of deionized water; (b) adding 0.25 weight percent of zinc metal to the solution; (c) allowing the solution to stand ambient for at least 48 hours; (d) adding stannous chloride [$SnCl_2 \cdot 2H_2O$] to the solution in a weight concentration of 0.1% per 100 ml.; and (e) slowly adding 1N-NaOH to the solution to adjust the pH to the range 5.1–5.4.

27. The wetting solution of Example XXXIII-J which is obtained by (a) adding 1 weight percent of powdered aluminum chloride [$AlCl_3$] to 100 ml. of deionized water; (b) raising the pH to about 5.2 with a univalent alkali such as NaOH; (c) heating the solution for about 2 hours at about 60°–80°C; (d) adding 0.5–2 weight percent of stannous chloride [$SnCl_2 \cdot 2H_2O$] to form a flocculant; (e) decanting the supernatant portion of the solution which portion is the colloid wetting solution and additionally (f) adding 0.01M-HCl to the flocculant to form the wetting solution also.

28. The wetting solution of Example XXXIII-K which is obtained by (a) dissolving 1 to 2 weight percent of stannous chloride [$SnCl_2 \cdot 2H_2O$] in 1-M HCl; (b) dissolving 0.5 weight percent palladium [$PdCl_2$] in 1-M HCl; and (c) intermixing the two solutions and adding .5M-NaOH to the resultant solution until a pH in the range of 0.8–1.5 is obtained.

29. The wetting solution of Example XXXIII-L which is obtained by (a) dissolving 1 to 2 weight percent palladium chloride [$PdCl_2$] in 1-M HCl; (b) adding to the resultant solution 2 weight percent stannic chloride [$SnCl_4 \cdot 5H_2O$]; (c) dissolving 0.3 weight percent stannous chloride [$SnCl_2 \cdot 2H_2O$] in 1-M HCl and combining this solution with the first solution comprising palladium chloride and stannic chloride; and (d) raising the pH of the mixture to about 1 with 0.5M-NaOH.

30. The yellow wetting solution of Example XXXIII-G which is obtained by (a) dissolving 1–2 weight percent of stannic chloride [$SnCl_4 \cdot 5H_2O$] in 100 ml. of deionized water and (b) adding 1–5 weight percent of zinc metal thereto with stirring until complete dissolution thereof.

31. The yellow wetting solution of Example XX which is obtained by (a) dissolving one weight percent of mercuric chloride (corrosive sublimate) [$HgCl_2$] in 100 ml. of deionized water, (b) slowly adding a dilute univalent alkali, such as NaOH, thereto to raise the pH to about 5 and (c) stirring the resultant solution for several minutes.

A suitable redox agent is then selected. A suitable redox agent may comprise either an oxidizing agent or a reducing agent, depending upon the colloidal wetting solution employed. Solutions of Examples III-A, III-B, V-C, VI, X-G, XXVI-F, XXVI-G, XXVI-H, XXVII, XXVIII, XXXIII-A, XXXIII-B, XXXIII-C, XXXIII-D, XXXIII-E, XXXIII-F, XXXIII-G, XXXIII-H, XXXIII-I and XXXIII-J (described above) comprise metal ions ($Ti^{+3}$, $V^{+4}$, $Cr^{+3}$, $Fe^{+2}$, $Sn^{+2}$, $Pb^{+2}$, $Bi^{+3}$) in insoluble hydrous oxide form, which are capable of reducing an activating metal ion, e.g., $Pd^{+2}$, to an activating metal, e.g., Pd, upon exposure to an activating solution, e.g., a $PdCl_2$ solution. Such wetting solutions will be referred to as positive sensitizers. Therefore, when a positive sensitizer is employed, a suitable oxidizing agent is selected which is destined to be used to contact selected areas of layer 72, to oxidize the metal ions, e.g., $Ti^{+3}$, $V^{+4}$, $Cr^{+3}$, $Fe^{+2}$, $Sn^{+2}$, $Pb^{+2}$, $Bi^{+3}$, contained therein to a higher valence ionic species, e.g., $Ti^{+4}$, $V^{+5}$, $Cr^{+6}$, $Fe^{+3}$, $Sn^{+4}$, $Pb^{+4}$, $Bi^{+5}$. Such an oxidation renders the contacted areas incapable of reducing an activating metal ion, e.g., $Pd^{+2}$, to an activating metal, e.g., Pd. Suitable oxidizing agents are well known in the art and some typical suitable oxidizing agents include dichromate and permanganate salts, e.g., $K_2Cr_2O_7$, $KMNO_4$, etc.

Figure 2:
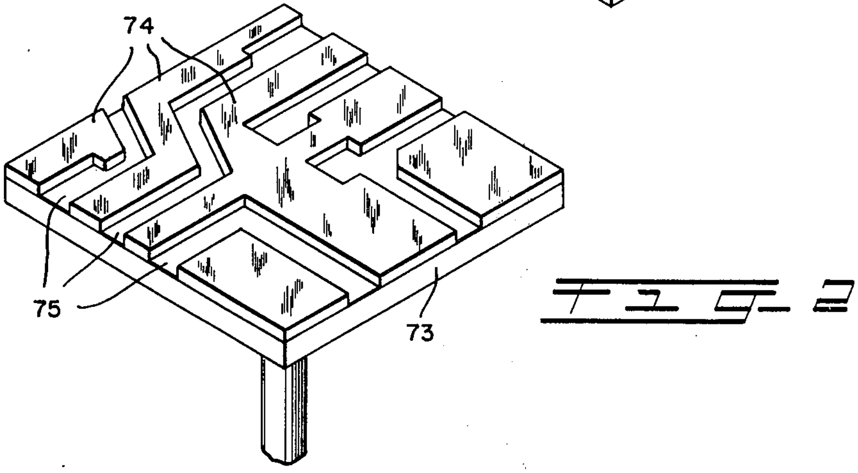
FIG. 2 is an isometric view of a first typical stamp utilized in the present invention.
Figure 3:
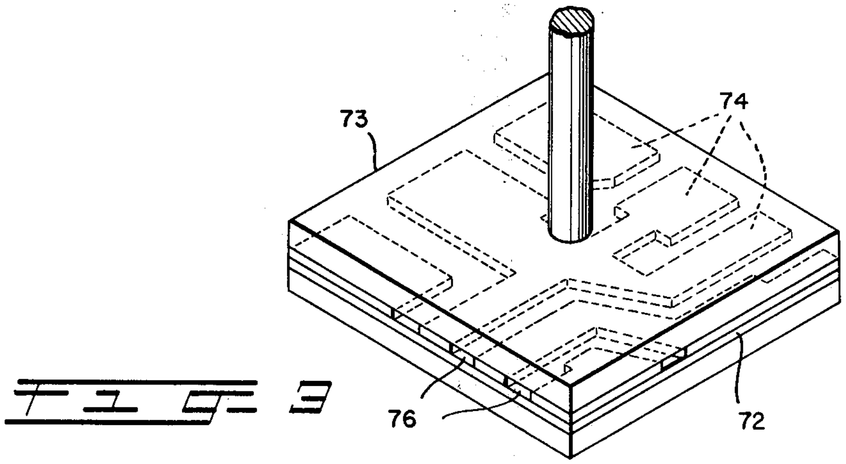
FIG. 3 is an isometric view of the stamp of FIG. 2 applied to the coated substrate of FIG. 1.

Referring to FIG. 2, a conventional stamp 73 is selected having upraised or elevated areas 74 as compared to areas 75 of the stamp 73. The selected oxidizing agent is applied to areas 74 of the stamp 73. Referring to FIG. 3, the stamp 73 is impressed on or applied to the layer or coat 72, comprising the positive sensitizing solution. The oxidizing agent oxidizes areas of layer 72 contacted by and corresponding to areas 74 of the stamp 73, thereby rendering these contacted areas incapable of reducing an activating metal ion to an activating metal. A sensitized pattern is thereby delineated or described, comprising areas 76 of the layer 72 on the surface 71 corresponding to areas 75 of the stamp 73. Areas 76 are capable of reducing an activating metal ion, e.g., $Pd^{+2}$, to an activating metal, e.g., Pd.

Where the selected colloidal wetting solution is a negative one, i.e., one which comprises ionic species which cannot in their initial state, reduce an activating metal ion, e.g., $Pd^{+2}$, to an activating metal, e.g., Pd, but which comprises at least one ionic species which in a lower valence state (reduced state) is so capable, a suitable redox agent comprising a reducing agent is selected. Solutions of Examples X-A, X-B, X-C, X-D, X-E, X-F and XX (described above), comprising metal ions ($Fe^{+3}$, $Hg^{+2}$) incapable of reducing an activating metal ion, e.g., $Pd^{+2}$, to an activating metal, e.g., Pd, are typical negative solutions. Suitable reducing agents are those agents which are capable of reducing the metal ions contained in the negative solution, e.g., $Fe^{+3}$, $Hg^{+2}$, to lower valence ionic species which are capable of reducing an activating ion, e.g., $Pd^{+2}$, to its corresponding activating metal. Such suitable reducing agents are well known in the art and some typical reducing agents are formaldehyde, stannous salts, etc.

Figures 4, 5, 6, 7:
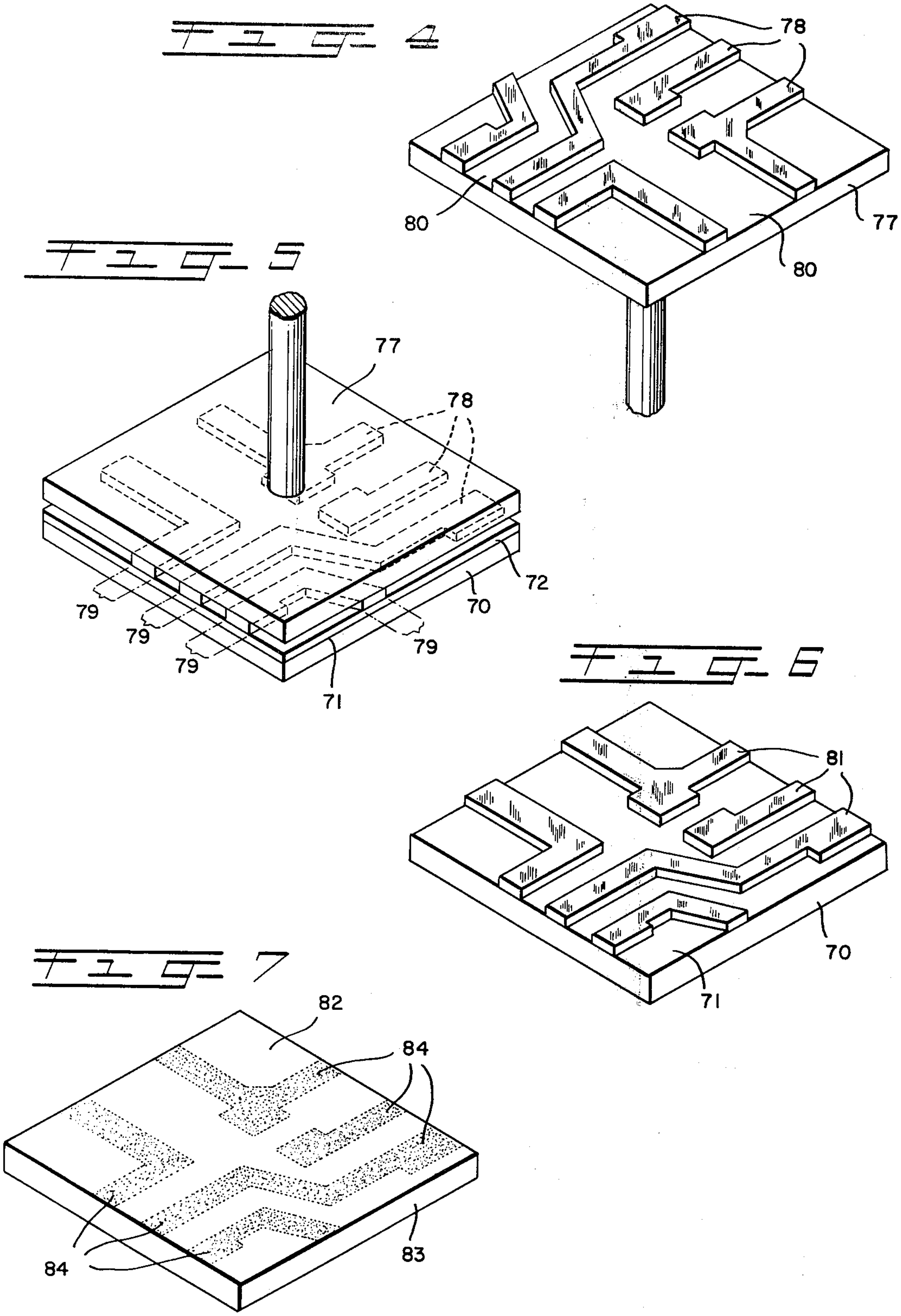
FIG. 4 is an isometric view of a second typical stamp utilized in the present invention.
FIG. 5 is an isometric view of the stamp of FIG. 4 applied to the coated substrate of FIG. 1.
FIG. 6 is an isometric view of the substrate of FIG. 1, having a deposited metal pattern thereon.
FIG. 7 is an isometric view of a suitable electrically non-conductive substrate which has a colloidal wetting solution patterned surface.

Referring to FIG. 4, a stamp 77 is selected having raised portions or areas 78 as compared to areas 80 of the stamp 77. The selected reducing agent, e.g., a $Sn^{+2}$ ion containing solution, is applied to areas 78 of the stamp 77. Referring to FIG. 5, the stamp 77 is impressed or applied to the layer or coat 72, comprising the negative solution. The reducing agent reduces areas 79 of layer 72, contacted by and corresponding to areas 78 of the stamp 77, to render these contacted areas, i.e., areas 79, capable of reducing an activating metal ion, e.g., $Pd^{+2}$, to an activating metal, e.g., Pd, thereby forming or delineating a sensitized pattern so capable.

After selectively contacting layer 72, comprising either at least one positive sensitizer or at least one negative wetting solution, with a suitable redox agent, e.g., $MnO_4^-$ ions when colloidal $Sn^{+2}$ ions are present, $Sn^{+2}$ ions when colloidal $Fe^{+3}$ ions are present, to obtain the sensitized or activating metal reducing pattern, comprising selected coated areas of the surface 71 [76 (FIG. 3), 79 (FIG. 5)], the surface 71 is rinsed then activated.

It is to be noted that it is important that the sensitized pattern [comprising coated areas 76 (FIG. 3), 79 (FIG. 5)] be rinsed thoroughly in a cleaning medium, e.g., deionized water, after the sensitizing thereof. If such is not done, there is a possibility that a reduction of an activating species, e.g., $Pd^{+2}$, to which the sensitized pattern is destined to be exposed, will occur in nonadherent form on the surface 71. In this regard, it should be stressed that unlike other prior electroless metal deposition methods utilizing stamping, printing, stenciling techniques, etc., water rinsing does not cause a resultant blurred image. On the contrary, a resultant electroless metal-deposited pattern or image having very clear detail and fine resolution is obtained.

Activation relates to providing a deposit of catalytic metal, e.g., noble metals such as Ir, Os, Pd, Pt, Rh, Rd, Au, Ag, over the areas [76 (FIG. 3), 79 (FIG. 5)] of the surface 71, comprising the sensitized pattern, in sufficient quantity to successfully catalyze a plating reaction once the surface 71 is introduced into an electroless plating bath. The sensitized pattern so capable of reducing an activating metal, e.g., Pd, from an activating metal salt, e.g., $PdCl_2$, is exposed to the activating metal salt, e.g., $PdCl_2$, whereby the activating metal salt is reduced to the activating metal, e.g., Pd, which in turn is deposited thereon. The deposited activating metal, e.g., Pd, acts as a catalyst for localized further plating. It is to be understood that the various activating metal ions and their solutions, the conditions and procedures of activation are well known in the art and will not be elaborated herein. Such activators and procedures may be found, in part, in "Metallic Coating of Plastics," William Goldie, Electrochemical Publications, 1968.

After activation, the activating metal-deposited substrate 70 may be rinsed with water, typicallly for about one minute at 25°C, whereafter it is immersed in a standard electroless plating bath containing a metal ion, e.g., $Cu^{+2}$, destined to be reduced by the catalytic activating metal species, e.g., Pd. The metal ion, e.g., $Cu^{+2}$, is reduced by the activating metal, e.g., Pd, and is electrolessly deposited on the surface 71 of the substrate 70 to form an electroless metal-deposited pattern 81 thereon as shown in FIG. 6. It is to be pointed out that the electroless baths, the electroless plating conditions and procedures are well known in the art and will not be elaborated herein. Reference is again made to "Metallic Coating of Plastics," for some typical examples of electroless baths and plating parameters.

Where it is desired to build up the electroless metal-deposited pattern, the electroless metal deposit is subjected to a conventional electroplating treatment whereby the electroless metal deposit is built up with either the same metal or a different metal, depending, of course, upon the application of the deposited pattern.

It is to be noted and stressed at this point that the resultant electroless and/or electrodeposited pattern obtained has very fine resolution, typically on the order of 0.0001 inch and does not exhibit running or blurring of its features.

In a second embodiment of the present invention, referring back to FIG. 1, the surface 71 of the substrate 70 is coated with a solution layer or coat 72 comprising activating metal ions, e.g., $Pd^{+2}$ ions. Referring to FIG. 4, a positive colloidal sensitizing solution or sensitizer, e.g., solutions of Examples III-A, III-B, V-C, VI, X-G, XXVI-F, XXVI-G, XXVI-H, XXVII, XXVIII, XXXIII-A, XXXIII-B, XXXIII-C, XXXIII-D, XXXIII-E, XXXIII-F, XXXIII-G, XXXIII-H, XXXIII-I, and XXXIII-J (previously described) is applied to surfaces 78 of the stamp 77 whereafter, as illustrated in FIG. 5, the stamp 77 is impressed on the surface 71 coated with layer 72. The activating metal ions, comprising areas 79 of layer 72 (FIG. 5) corresponding to surfaces 78, are reduced through the selective contacting of the positive sensitizer to yield an activating metal-deposited pattern corresponding to areas 79. The activating metal-deposited pattern corresponding to areas 79 is then immersed in a suitable electroless plating bath to obtain the electroless metal-deposited pattern 81, as illustrated in FIG. 6. It is again to be stressed that the resultant electroless metal-deposited pattern has very clear detail and fine resolution.

It is, of course, to be understood that alternatively, a positive colloid sensitizer, e.g., solutions of Examples III-A, III-B, V-C, etc., or any solution, colloidal or non-colloidal, comprising an ionic species capable of reducing an activating metal ion, e.g., $Pd^{+2}$, to an activating metal, e.g., Pd, may be used to first coat the surface 71 to form layer 72 (FIG. 1). Referring again to FIG. 4, a suitable colloidal activating wetting solution is selected and applied to surfaces 78 of stamp 77. Suitable colloidal activating solutions are disclosed in Kenney, referred to above. More specifically, some of these solutions are:

1. The brown wetting solution of Example XIII-A which is obtained by (a) adding 1 weight percent of palladium chloride [$PdCl_2$] to 100 ml. of deionized water; and (b) stirring the resultant mixture to dissolve the maximum amount of $PdCl_2$.

2. The brown wetting solution of Example XIII-B which is obtained by (a) adding 10 ml. of 5 weight percent palladium chloride [$PdCl_2$] to 100 ml. of deionized water; and (b) raising the initial pH to about 3.0–3.2 with 1N-NaOH.

3. The yellow wetting solution of Example XIV which is obtained by (a) dissolving 1 weight percent of platinous dichloride [$PtCl_2$] in 100 ml. of hot (70°C), dilute HCl; (b) cooling the resultant solution; and (c) raising the pH of the cooled solution to about 3 with a univalent alkali.

4. The wetting solution of Example XVI which is obtained by dissolving ¼–½ weight percent of silver nitrate [$AgNO_3$] in either 100 ml. of deionized water or in 100 ml. of 50% deionized water and 50% ethyl alcohol and rapidly raising the pH to an ultimate value of 8–9 with an univalent alkali such as KOH or NaOH.

5. The brown wetting solution of Example XVII-A which is obtained by (a) dissolving one weight percent of auric chloride [$AuCl_3$] in 100 ml. of deionized water; and (b) slowly raising the pH to about 4-5 with a univalent alkali while stirring and heating (30°–40°C) the resultant solution.

6. The yellow wetting solution of Example XVII-B which is obtained by (a) dissolving ½–1 weight percent of auric chloride in 100 ml. deionized water; and (b) slowly evaporating the resultant solution in ambient until 1/5 of the volume remains [2–4 weeks].

7. The brown wetting solution of Example XVII-C which is obtained by (a) dissolving one weight percent of auric chloride in 100 ml. of deionized water; and (b) raising the pH of the resultant solution to about 4 with NaOH.

As illustrated in FIG. 5, the stamp 77 is then impressed on the surface 71 coated with layer 72. The ionic species, e.g., $Sn^{+2}$ ions, capable of reducing the activating metal colloid solution, comprising areas 79 (corresponding to surfaces 78), react therewith to yield an activating metal-deposited pattern corresponding to areas 79. Again the activating metal-deposited pattern corresponding to areas 79 is immersed in a suitable electroless plating bath to obtain the electroless metal-deposited pattern 81 (FIG. 6) which exhibits no running or blurring of its features.

In a third embodiment of the present invention, referring to FIG. 4, a positive colloidal sensitizing solution or sensitizer, e.g., solutions of Examples III-A, III-B, III-C, III-E, V-C, etc. (previously described), is applied to surfaces 78 of the stamp 77. Referring to FIG. 7, the stamp 77 is impressed on a surface 82 of a suitable electrically non-conductive substrate 83, whereby a positive sensitizer pattern 84, corresponding to surfaces 78 of the stamp 77, is delineated on the surface 82.

The surface 82 having the impressed sensitizer pattern 84 thereon is first rinsed with water and is then immersed in a solution comprising an activating metal ion, e.g., $Pd^{+2}$, wherein the activating metal ion, e.g., $Pd^{+2}$, is reduced by the sensitizer solution, comprising pattern 84, to the activating metal, e.g., Pd, which in turn is deposited on the surface 82, in the form of the pattern 84. Again it is pointed out and stressed that the water rinsing does not lead to a resultant blurred pattern or image. The activating metal-deposited pattern is then subjected to a conventional electroless metal plating bath to obtain the metal-deposited pattern 81 (FIG. 6). The electroless metal-deposited pattern 81 may then in turn be electroplated using conventional electroplating techniques and plating baths.

Again, it is, of course, to be understood that alternatively, the impressed pattern 84 (FIG. 7) may comprise an activating colloidal solution, e.g., solutions of Examples XIII-A, XIII-B, XIV, XVI, XVII-A, XVII-B, and XVII-C (previously described). Such an impressed activating metal pattern is obtained by first applying the activating colloidal solution to areas 78 of the stamp 77 (FIG. 5) and impressing the stamp on the surface 82 of the substrate 83. The impressed activating metal solution pattern 84 is then subjected or treated by a solution, colloidal or non-colloidal, comprising an ionic species capable of reducing the activating metal ion, e.g., $Sn^{+2}$ ions where $Pd^{+2}$ is the activating metal ion. Upon such treatment, the activating metal ion, e.g., $Pt^{+2}$, $Pd^{+2}$, etc., is reduced to the activating metal, e.g., Pt, Pd, and deposited on the surface 82 in the form of the pattern 84.

It is to be noted at this point that all the embodiments described above can be carried out using conventional offset and flexographic printing techniques and other conventional printing techniques which are known in the art.

EXAMPLE I

A. A surface of a commercially obtained polyimide sheet was coated or sensitized with a positive tin colloidal sensitizing solution (solution of Example XXVI-G, previously described). A rubber stamp, similar to that described in FIG. 3 was immersed in an aqueous solution comprising 1 weight percent $KMNO_4$ and $H_2SO_4$. The stamp was impressed on the coated surface to delineate a first pattern incapable of reducing an activating metal ion to an activating metal thereby resulting in a second pattern so capable. The pattern-delineated substrate was then immersed in a 0.05 weight percent aqueous $PdCl_2$ solution whereby a Pd metal-deposited pattern was obtained. The palladium metal-patterned substrate was then immersed in a conventional electroless copper bath whereby a 0.03 mil. electroless copper deposit was obtained corresponding to the palladium pattern.

B. The procedure of Example I-A was repeated except that a steel stencil was employed instead of the rubber stamp. A clearly delineated 0.04 mil. copper pattern was obtained.

EXAMPLE II

A surface of a commercially obtained epoxy-coated steel substrate was selectively coated with an aqueous wetting Pd activating solution (comprising 0.5 weight percent palladium chloride, pH=5). The wetting Pd solution was applied to a rubber stamp, similar to that described in FIG. 4 and the stamp in turn was impressed on the surface of the substrate to impress a Pd activating solution pattern thereon. The activating solution patterned surface was then exposed to a commercially obtained electroless copper bath containing formaldehyde. The formaldehyde reduced the $Pd^{+2}$ ions to $Pd^o$ and the $Pd^o$ reduced the $Cu^{+2}$ ions present to Cu thereby depositing a 0.03 mil. copper pattern corresponding to the rubber stamp delineated pattern.

EXAMPLE III

A. A commercially obtained epoxy-coated steel substrate was immersed in a colloidal tin solution (solution of Example XXVI-G previously described). The tin-sensitized substrate was then rinsed in running deionized water for one minute and then dried. A rubber stamp, similar to that described in FIG. 4 was coated with an aqueous wetting palladium activating solution (comprising 0.5 weight percent palladium chloride, pH=5). The activating solution coated stamp was impressed on a surface of the sensitized substrate to deposit a palladium pattern thereon. The palladium-patterned substrate was then immersed in a conventional electroless copper deposition bath wherein a 0.03 mil. copper pattern was obtained.

B. The procedure of Example III-A was repeated except that a steel stencil was employed instead of a rubber stamp. A finely delineated 0.04 mil. copper pattern was obtained.

EXAMPLE IV

A surface of a commercially obtained polyimide sheet was selectively coated with an aqueous wetting tin solution (solution of Example XXVI-G, previously described). The wetting tin solution was first applied to a rubber stamp, similar to that described in FIG. 4 and the stamp in turn was impressed on the surface of the substrate to impress a positive colloidal wetting solution pattern thereon. The patterned surface was then immersed in a 0.05 weight percent aqueous $PdCl_2$ solution whereby a Pd metal deposited pattern was obtained. The palladium metal-patterned substrate was then immersed in a conventional electroless copper bath whereby a 0.03 mil. electroless copper pattern was obtained.

EXAMPLE V

A. The procedure of Example I-A was repeated except that the delineated pattern was produced using a conventional offset printing apparatus. Applied to the press of the printing apparatus was an aqueous oxidizing solution comprising one weight percent $KMnO_4$ and 50 weight percent gelatin. A resultant $50 \times 10^{-6}$ inch electroless copper pattern was obtained having a resolution of 0.001 inch.

B. The procedure of Example V-A was repeated except that the resultant electroless pattern obtained was built up to a thickness of 1 mil. using a copper electroplating bath, commercially obtained.

C. The procedure of Example V-A was repeated except that the aqueous oxidizing solution comprised 0.1 weight percent $Na_2Cr_2O_7$ and 50 weight percent gelatin. A resultant $50 \times 10^{-6}$ inch electroless copper pattern was obtained.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A method of depositing a metal pattern on a surface of a substrate, which comprises:

a. coating the surface with a solution comprising an activating metal ion; and b. impressing said coated surface with a wetting sol, comprising an insoluble hydrous oxide of an element selected from the group consisting of Sn, Pb, Ti, V, Cr, Fe and Bi, said hydrous oxide being capable of reducing said activating metal ion to an activating metal to delineate a pattern corresponding to the desired metallic pattern and deposit said activating metal on said delineated pattern.

2. The method as defined in claim 1 which further comprises treating said activating metal-deposited pattern with an electroless metal plating solution to deposit an electroless metal thereon.

* * * * *